JEREMY M. HARRIS
INVENTOR
BY Gray, Mase and Dunson, ATTORNEYS

Jan. 27, 1970 J. M. HARRIS 3,491,603

MECHANICAL AMPLIFIER

Filed Feb. 13, 1967 5 Sheets-Sheet 2

JEREMY M. HARRIS
INVENTOR

BY Gray, Mase and Dunson, ATTORNEYS

Jan. 27, 1970 J. M. HARRIS 3,491,603

MECHANICAL AMPLIFIER

Filed Feb. 13, 1967 5 Sheets-Sheet 3

JEREMY M. HARRIS
INVENTOR

BY Gray, Mase and Dunson, ATTORNEYS

Jan. 27, 1970 J. M. HARRIS 3,491,603

MECHANICAL AMPLIFIER

Filed Feb. 13, 1967 5 Sheets-Sheet 4

JEREMY M. HARRIS
INVENTOR

BY Gray, Mase and Dunson, ATTORNEYS

JEREMY M. HARRIS
INVENTOR

BY Gray, Mase and Dunson, ATTORNEYS 3,491,603

MECHANICAL AMPLIFIER

Jeremy M. Harris, Worthington, Ohio, assignor to The Battelle Development Corporation, Columbus, Ohio, a corporation of Delaware Filed Feb. 13, 1967, Ser. No. 615,687
Int. Cl. F16h *21/12*
U.S. Cl. 74—63 6 Claims

ABSTRACT OF THE DISCLOSURE

This invention relates to a mechanical power amplifier that includes a rotating capstan-type drum having at least two flexible elements wrapped around the drum with one end of each of the flexible elements connected to input means on one side of the drum and the opposite end of each of the flexible elements connected to output means on the opposite side of the drum. One embodiment is a multi-stage amplifier having several sets of flexible elements, while the other embodiment is adapted to amplify the signals for an instrument drive. The distortion between input and output signal is minimal and the response of the amplifier is very rapid.

This invention refers to a mechanical power amplifier based on the principle of a capstan force multiplier which is sensitive, bi-directional, with little back lash and very little inherent inertia. More particularly, it refers to a mechanical amplifier that may be used as a multi-stage amplifier or a general control and instrument amplifier.

There are many types of amplifiers in existence at the present time which may be classified in the two general categories of electronic amplifiers and mechanical amplifiers. Electronic amplifiers are typically used in public address systems, radios, television, etc. In the field of mechanical amplifiers, some common examples are power steering and power brakes. One basic requirement in the field of amplification is to increase energy level of a small input signal to a degree where it can either overpower a large resisting force or be used to drive other components in a servomechanism. In either case, there are certain inertial and frictional forces that must be overcome if the desired result of faithful signal reproduction is to be achieved. If in prior amplifying devices, the amplified signal switches a motor on and off, there is a definite lag time both in the starting time of the motor and the inertia in the system that is to be activated by the output signal. In this invention, the "motor" is in a sense already running and is also responsible for amplification. A problem associated with electronic amplifiers is the cost of the electronic components. With common mechanical amplifiers, for example hydraulic amplifiers, there is a loss of "feel" associated therewith.

The amplifier described herein has both heavy duty and sensitive or light duty applications. Among the heavy duty applications, the amplifier may be used for vehicle steering and guidance, cranes, hoists, elevators, operating-controlled machine tools, conveyor synchronizing, remote operation of various devices, and similar applications. Among the low power applications are such things as telechirics, servomechanisms, general control and instrument amplification, and other ultrasensitive applications. In the subsequent description one form of the invention will be discussed with respect to the amplification of audio signals on a direct mechanical basis.

Briefly described, this invention includes a stepped capstan drum having at least two flexible elements wrapped around each step of the drum with the portions of the flexible elements on one side of the capstan drum that emerge from the drum in the direction of rotation receiving an input signal and the flexible elements on the opposite side of the capstan drum that emerge against the direction of rotation connected to an output, each step in the capstan drum being a stage of amplification and the output of one stage of amplification being the input signal for the succeeding step of amplification.

This invention also includes a cylinder or drum having at least two flexible elements wrapped around the drum with the portions of the flexible elements emerging from the drum in the direction of rotation receiving an input signal and the ends of flexible elements of the opposite side connected to an output signal, the input signal being impressed upon the flexible elements by varying friction between at least one of said flexible element and a moving surface.

It is an object of this invention to provide a multiple-stage mechanical amplifier capable of amplifying input signals of at least 1800 cycles per second with a power gain of at least 10,000, i.e., capable of amplifying signals in the audio range.

Another object of this invention is to provide a relatively simple mechanically amplified linear feedback servomechanism providing an instrument control wherein the position of the recording device is proportional to a voltage signal applied at the input.

Another object of this invention is to provide a positioning servomechanism in which energy is drawn from a constantly rotating prime mover in such a manner that the response of the instrument is essentially independent of the inertial character of the prime mover.

Another object of this invention is to effectively reduce the inertial lag of servomechanism components and other loads which require acceleration and deceleration in the control of the instrument.

Still another object of this invention is to provide a mechanical amplifier wherein an operator provides an input signal and still retains a "feel-control" over the output signal.

One advantage of this invention is the relatively low cost of the components as compared with other amplification systems.

Another advantage of this invention is that the elements transmitting the signal from the input source to the output load may be constructed of lightweight low inertia material to provide a relatively faithful correspondence between input and output signal and an extremely fast response.

Other objects and advantages will be apparent from the description that follows, the drawings, and the appended claims.

Figure 1:
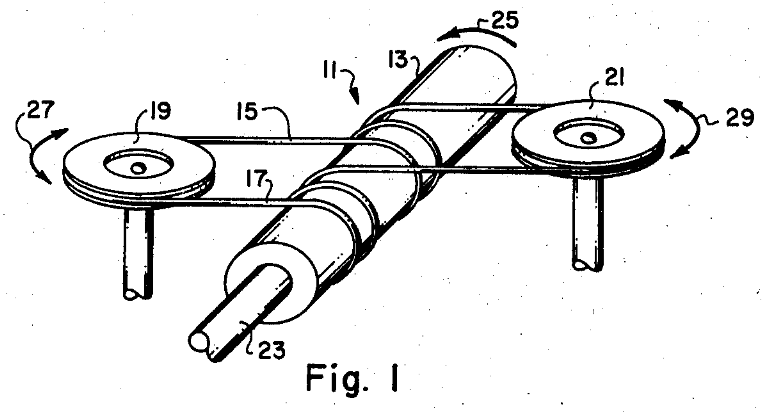
FIG. 1 is a perspective view of the basic elements that make up the invention herein described.

Referring to FIG. 1, the basic mechanical amplifier 11 includes a cylinder or drum 13, at least two flexible elements 15 and 17, an input means 19, and an output means 21. The drum 13 which is attached to a shaft 23 is connected to a power source (not shown) which rotates the drum at a constant speed in the direction of the arrow 25. The flexible elements 15 and 17 are stationary with respect to the drum (that is they slip) when there is no signal or movement applied at the input means 19 and such a condition also exists in the embodiments hereinafter described. When the pully 19 is rotated in either direction as indicated by the arrow 27, it tightens or loosens the flexible elements 15 and 17 on the drum 13 and as a result the output pulley 21 is rotated in the same direction as indicated by the arrow 29. If, for example, the pulley 19 is rotated counterclockwise, the flexible element 15 is tightened on the drum 13 and the force on the flexible element 15 is amplified by the rotation of the drum 13 and moves the output 21 also counterclockwise but with a force that is considerably increased over the force applied to the pulley 19. Similarly, when the pulley 19 is rotated clockwise, the flexible element 17 is tightened on the drum 13 and the rotational effort of the drum is frictionally applied to the flexible element 17 and moves the pulley 21 clockwise. The important feature of this basic element is that it achieves bi-directional amplification with only one drum. A rotation of the input pulley 19 tightens the flexible elements 15 or 17 on one side of the drum 13 but loosens it on the opposite side. The input signal for the amplifier is applied to that portion of the flexible elements 15 and 17 that emerge from the drum 13 with the direction of rotation while the output portion of the flexible elements 15 and 17 emerge from the drum 13 against the direction of rotation. This results in the appearance of a differential force at the output pulley 21, which is proportional to and co-directional with the input force, but is larger by a multiple $e^{\mu\beta}$, where $\mu$ is the coefficient of friction, $\beta$ is the wrap angle in radians and $e$ is the base of the Naperian logarithm (2.718). This factor, the torque gain, can be made anywhere from 4 to 50 or more with satisfactory results. Wraps of two or three turns are usually best with typical co-efficients of friction ranging from 0.1 to 0.3. The input and output portions of the flexible elements 15 and 17 need not emerge from the drum 13 at a 180° angle relationship, for example the input ends and output ends could be on the same side of the drum 13 or have a 90° relationship. The action of the amplifier 11 is very smooth and stable. Any tendency for the output to overrun or lag the input will result automatically in a corrective torque tending to restore synchronism. In this sense, the amplifier 11 is itself a miniature servosystem. The motion gain of the single drum form may be varied conveniently by using different size pulleys for output and input. The overall power gain of the amplifier will be the product of the force gain and the velocity gain. The flexible elements or cords 15 and 17 may be pinned to the pulleys 19 and 21 for restricted motion, or the rotation may be continuous.

Figure 2:
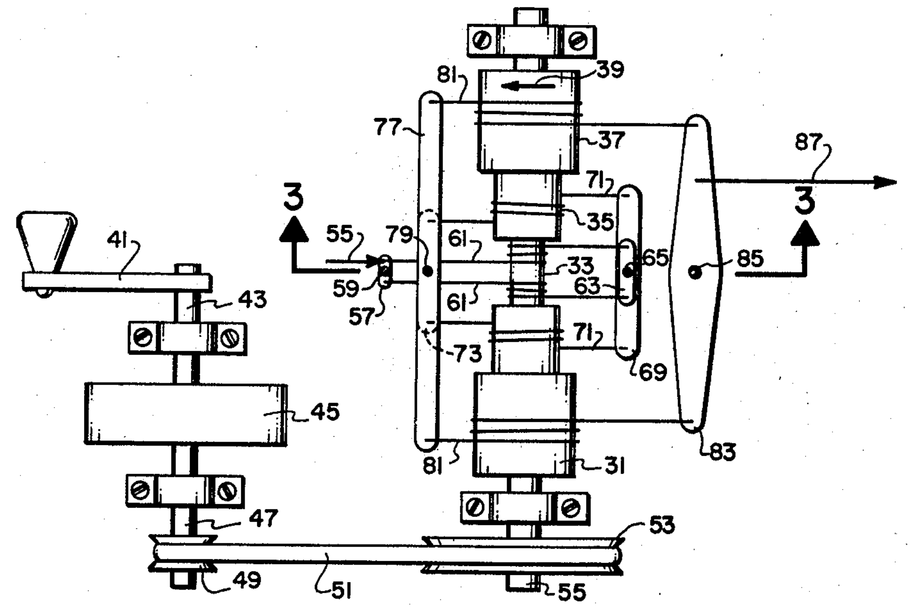
FIG. 2 is a diagram of the multi-stage mechanical amplifier.
Figure 3:
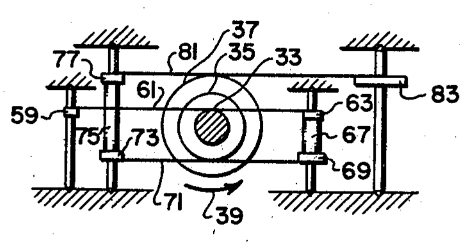
FIG. 3 is a cross-sectional view taken along the lines 3—3 of FIG. 2.

A remarkably compact multistage mechanical amplifier is shown in FIGS. 2 and 3. This embodiment of the invention is capable of amplifying input signals of at least 1800 cycles per second at least 10,000 times. The rotating drum 31 has a first section 33 having a small diameter, a second section 35 having a middle size diameter and a third section 37 having a large diameter. The purpose of the stepped diameters is to provide a drum surface velocity for each stage that is appropriate to the velocity gain of the previous stage. The drum 31 is rotated in the direction of the arrow 39. Suitable rotation means are provided such as a crank handle 41 connected to a shaft 43 which drives a speed increasing mechanism 45 connected to an output shaft 47. The output shaft 47 drives a pulley 49 connected by a belt 51 to a pulley 53. Pulley 53 is attached to a shaft 55 connected to the drum 31. The input (which in the audio-amplifier version is a small diaphragm connected by a stiff wire to lever 57) represented by the arrow 55 is applied to a lever 57 which is pivoted at its midpoint 59. The pivoted lever 57 is connected to a pair of flexible elements 61—61 which are wrapped around the drum section 33 and connected to each end of an output lever 63 which is pivotally mounted at its center 65. Lever 57, flexible elements 61—61, drum section 33, and lever 63 represent the first stage of amplification. Lever 63 is rigidly connected by means of a column 67 (FIG. 3) to an input lever 69 also pivotally mounted at its center. The ends of lever 69 are connected to flexible elements 71—71 which are in turn wrapped around drum section 35 and connected to the ends of a lever 73 which is pivotally mounted at its center. Lever 69, flexible elements 71—71, drum section 35, and lever 73 represent the second stage of amplification. Lever 73 is directly connected by means of a column 75 to input lever 77 pivotally mounted at its center 79. The ends of the lever 77 are connected to flexible elements 81—81 which are wrapped around the third section 37 of the drum 31 and connected to the ends of the final output lever 83 which is pivotally mounted at its center 85. Lever 77, flexible elements 81—81, drum section 37, and lever 83 represent the third stage of amplification. Lever 83 is connected to an output which is represented by the arrow 87 (in the audioamplifier this is a wire connected to the diaphragm of a loud speaker). It should be noted that the flexible elements 61—61, 71—71, and 81—81, are wrapped around their respective drum sections 33, 35, and 37, in such a manner that any movement of the input lever 57 causes all the other levers to be driven in the same rotational sense. This is important to ensure that the amplification takes the "right direction." Again note that all input portions of the flexible elements emerge from the drum with the rotational direction and the output portions emerge against the rotational direction of the rotating drum. The multi-stage amplifier shown in FIGS. 2 and 3 may be used for a variety of purposes, however, the most striking example is observed when the input 55 is connected to a small diaphragm and the output 87 is connected to the diaphragm of a loud speaker and the human voice is amplified in the absence of a single watt of electrical power. One important requirement is that the surface speed of the drum must be faster than the linear movement of any of the flexible elements. The quality of amplification of the device shown in FIGS. 2 and 3 depends largely on reducing the inertia of the various elements that carry the signals. Response is decreased and distortion increased, for example as the weight of the levers is increased. The pivot points for the levers must have little friction and the flexible elements must be flexible in bending but should not stretch lengthwise.

Figure 4:
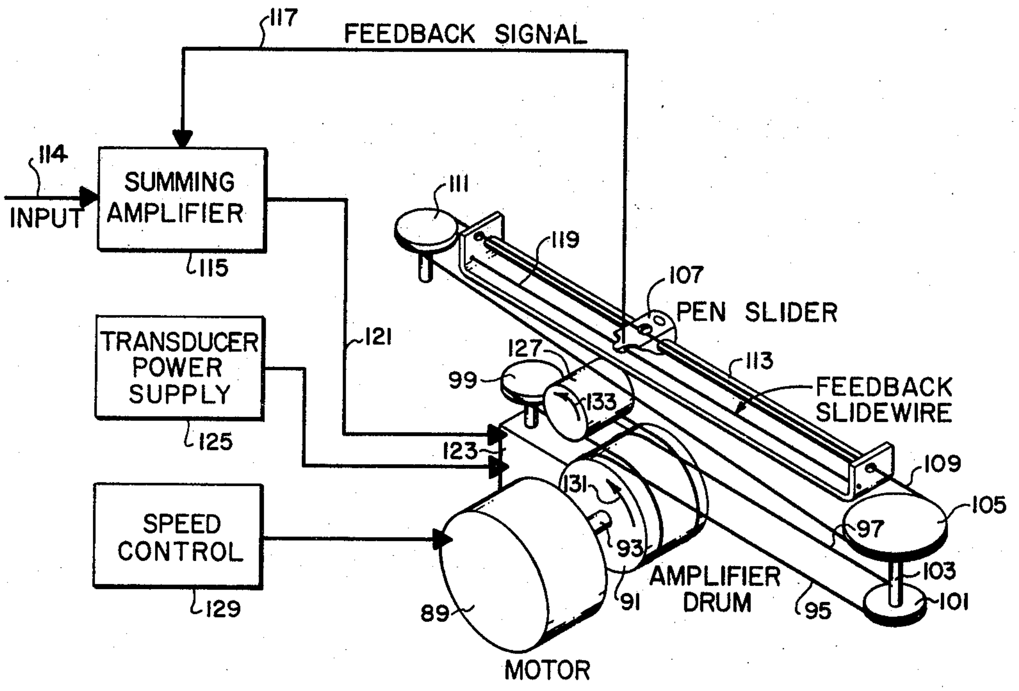
FIG. 4 is a perspective diagram of an instrument amplifier including a block diagram of the electrical input elements.
Figure 5:
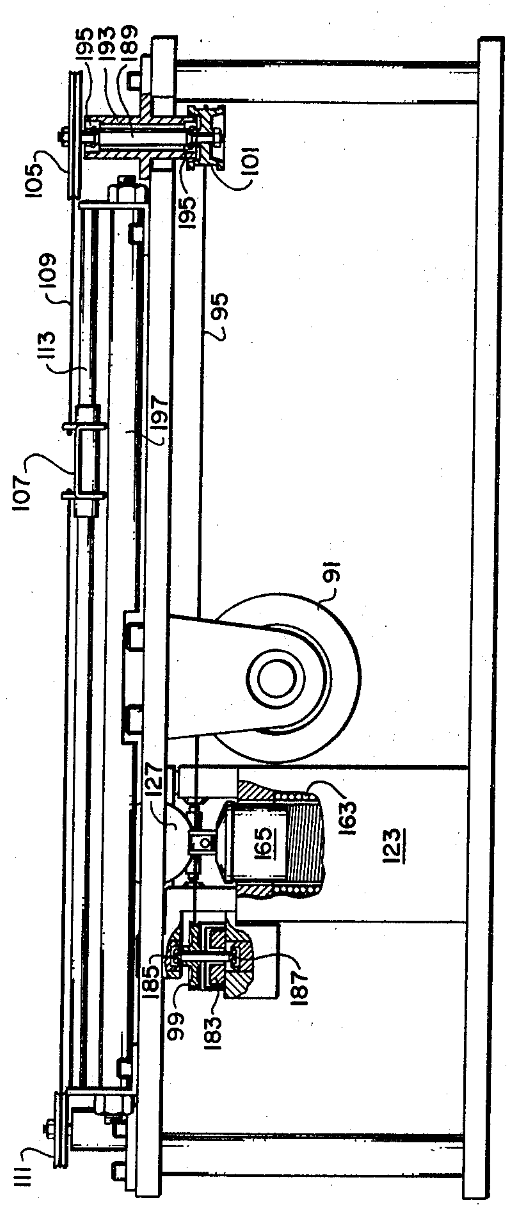
FIG. 5 is an elevational view of a general control and instrumentation amplifier.
Figure 6:
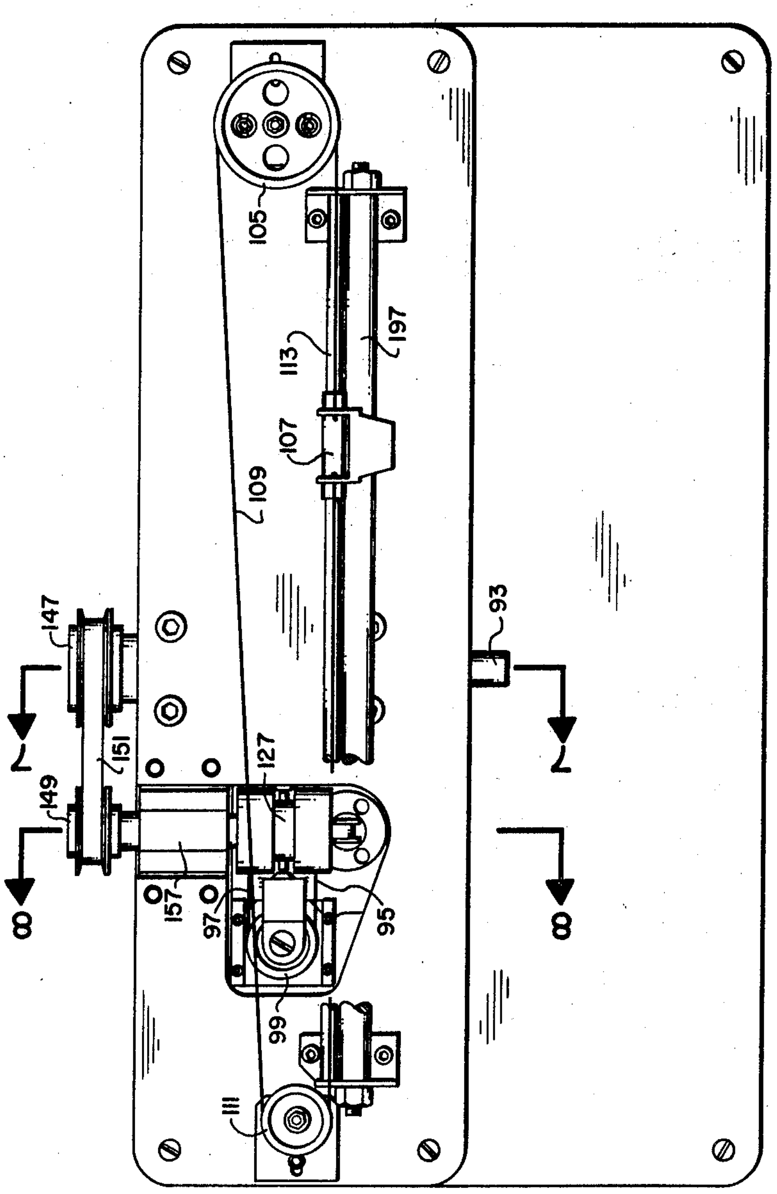
FIG. 6 is a plan view of the apparatus shown in FIG. 5.
Figure 7:
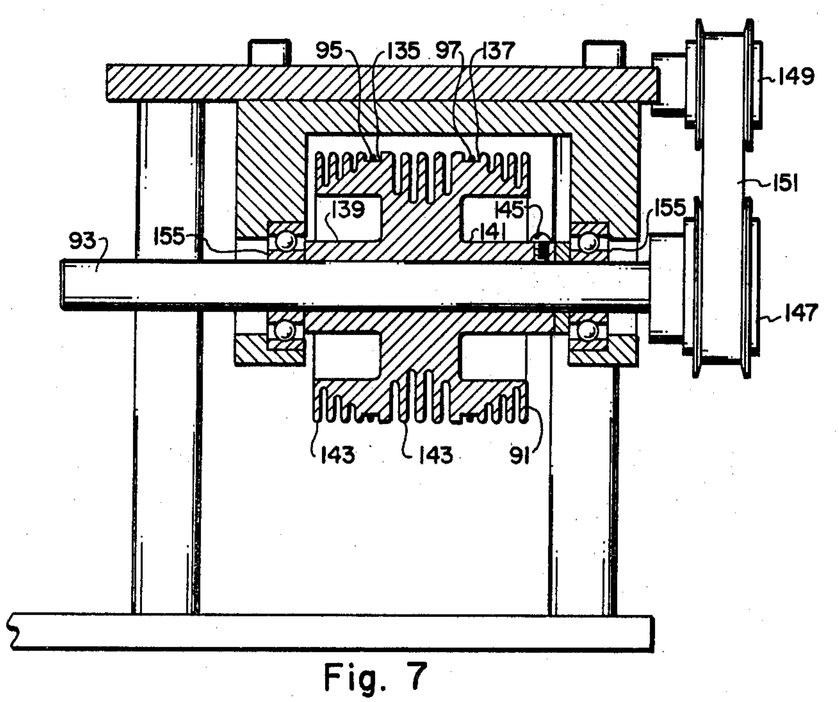
FIG. 7 is a sectional view taken along the line 7—7 of FIG. 6.
Figure 8:
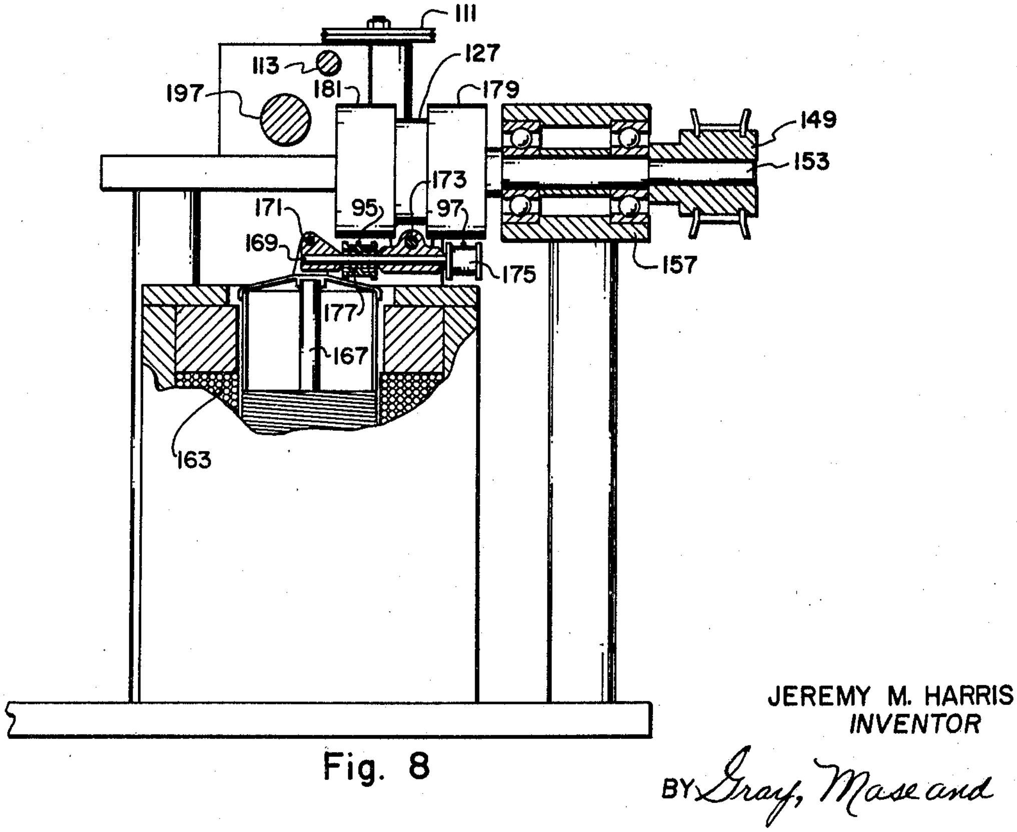
FIG. 8 is a sectional view taken along the lines 8—8 of FIG. 6.

FIG. 4 is a partially perspective diagram with the mechanical components of an instrument drive shown in perspective and with the electrical components shown in the block diagram. More complete details of the instrument drive are shown in FIGS. 5, 6, 7, and 8. In FIG. 4 a motor 89 drives the amplifier drum 91 being connected to the drum 91 by shaft 93. Two flexible elements 95 and 97 are wrapped around the drum 91 and around a pulley 99 at the input side and a pulley 101 at the output side. Output pulley 101 is connected by means of a shaft 103 to a drive pulley 105. Pulley 105 drives an element such as pen slider 107 by means of a flexible element or cord 109 that is passed around the pulley and connected to the pen slider 107. The cord 109 also is passed around an idler pulley 111 connected to the opposite side of the pen 107 so that when the pulley 105 is rotated in either direction the pen slider moves along the slide bar 113.

The input signal 114 passes into a summing amplifier 115 which also receives a feedback signal indicated by the arrow 117 from a feedback slide wire 119 that is contacted by the pen slider 107. Signals from the summing amplifier indicated by the arrow 121 are passed to a transducer 123 having a transducer power supply 125. The transducer 123 activates a rocker arm (shown in FIG. 8) that pushes the flexible elements 95 or 97 into engagement with a constantly rotating control drum 127. A speed control 129 may be provided if it is desirable to change the speed of the motor 89 and consequently the amplifier drum 91. The amplifier drum 91 rotates in the direction of the arrow 131 and the control drum 127 rotates in the direction of the arrow 133. Both of the drums 91 and 127 may be driven by the same motor.

FIGS. 5, 6, 7, and 8 show a more detailed embodiment of the control and instrument drive apparatus. The elements appearing in FIGS. 5, 6, 7, and 8 that correspond to the elements shown in FIG. 4 have been marked with the same identification numbers; however, certain elements shown in FIG. 4 are not included in FIGS. 5, 6, 7, and 8 such as the motor 89, slide wire 119, and the electrical controls. The amplifier drum 91 (FIG. 7) is provided with grooves 135 and 137 in order to retain the flexible elements 95 and 97 in their proper position. Amplifier drum 91 is also provided with two annular cavities 139 and 141 and a series of fins 143—143 so that the drum 91 remains relatively cool while operating and while idling with the flexible elements 95 and 97 in place. The flexible elements 95 and 97, are, of course, in constant frictional contact (although very light under non-amplification conditions) and have a tendency to generate some heat. The drum 91 is affixed to the shaft 93 by suitable means such as a set screw 145. A pulley 147 is also connected to shaft 93 and drives pulley 149 by means of a belt 151. Pulley 149 is connected to a shaft 153 and the control drum 127 is affixed to shaft 153. Suitable bearings 155—155 are provided for the shaft 93 and a bearing 157 is provided for the shaft 93 and a bearing 157 is provided for shaft 153.

The input signal is supplied to the transducer 123 which includes a stationary coil 163 and a movable coil 165. The movable coil 165 is attached to a rod 167 which is attached to a rod 169 by a pivot 171. Rod 169 is also mounted by means of a pivot 173 midway between two rollers 175 and 179 to form a rocker arm (169). The input signal will be either positive or negative so that when the coil 165 is moved in one direction, for example downward, the roller 175 will be moved against the control drum 127 pressing the flexible element 97 into frictional contact with the control drum surface 179. Flexible element 97 is immediately tightened on the amplifier drum 91 and rotates output pulley 101 which would be in a clockwise direction if pulley 101 were viewed from above. If the moving coil 165 is moved in the opposite direction, the roller 177 presses flexible element 95 against surface 181 of control drum 127 and the output pulley 101 is moved in the opposite direction. When the pen slider 107 reaches its proper position, so that the feedback signal 117 and input signal 113 are balanced in the summing amplifier, no current is supplied to the transducer and the transducer returns to a neutral position so that neither of the rollers 175 nor 179 contact the control surfaces 179 and 181 of the drum 127. Since the amplification of the input signal is quite high, the inertia of pulley 99 at the input side could have a tendency to cause an oscillation after the input signal has been cut off or reversed. Therefore, it is preferable to position a damping device such as a small magnet 183 beneath the pulley 99 as a brake on the coasting tendency of the pulley 99. Assuming that the amplification of the apparatus is 10 to 1, placement of the damping device 183 on the input side of the amplifier makes it ten times more effective than a damper placed on the output side. The pulley 99 is provided with suitable bearings 185 and 187 so that it rotates freely. The output pulley 101 is connected by a shaft 189 to the pen drive pulley 105. The shaft 189 is mounted in a suitable sleeve 193 and provided with bearings 195—195.

The pen drive pulley 105 may be made larger than the output pulley 101 thereby allowing the pen speed to be greater than the surface speed of the amplifier drum 91. A paper rest bar 197 is provided beneath the pen slider and the paper in this embodiment passes perpendicular to the sliding direction of the pen slider (the chart drive mechanisms are not shown).

The surface speed of the control drum 127 is slightly slower than the surface speed of the amplifier drum 91 since the linear speed of the flexible elements 95 and 97 should never exceed the surface speed of the amplifier drum 91. The flexible elements 95, 97, and 109 may be wrapped around their respective pulleys (99, 101, 105, and 111) several times and attached to the pulleys thereby preventing any tendency of the flexible elements to slip or slide on the pulleys.

In the previously described control and instrument drive a single stage of mechanical amplification produces a potentiometeric recorder drive having a basic frequency response approximately three times greater than the fastest comparable commercially available instrument drive and five to ten times greater than the response of typical strip-chart recorders with wide-chart capability. The accuracy of the mechanically amplified recorded drive is at least 0.5 percent of full scale using only simple position feedback. Pen slewing speeds of from 100 to 200 inches per second are readily obtained and are primarily a function of the constant r.p.m. at which the main amplifier drum is operated.

The amplifier drum 91, control drum 127, rocker arm 169 and flexible elements 95 and 97 are adaptable as the basic amplifier for many types of instruments and may also be constructed in multi-stage. Where on input signal (plus-minus or forward-reverse) is to be translated into movement, it is applied at the rocker arm 169 and thereby applied to the input portion of the flexible elements 95 and 97. Furthermore, due to the low inertia of the rocker arm, a mechanical-type of input signal can be applied directly to the rocker arm instead of being an electrical signal applied to the transducer coils 163 and 165.

It will be understood, of course, that while the forms of the invention herein shown and described, constitute preferred embodiments of the invention, it is not intended to illustrate all possible forms of the invention. It will also be understood that the words used are words of description rather than of limitation and that various changes in shape, size, and arrangement of parts may be made without departing from the spirit and scope of the invention herein disclosed.

What is claimed is:

1. Apparatus for amplifying the input signals to the movable output of instruments and the like, comprising:

(a) a cylinder rotatable in one direction at a selected speed;

(b) a pair of flexible elements wrapped around said cylinder, the pair of flexible element portions emerging from said cylinder with the direction of rotation being the input side and the pair of flexible element portions emerging from said cylinder against the direction of rotation connected to the movable output of the instrument;

(c) means for frictionally applying the input signal to the pair of flexible elements of the input side; and (d) said selected speed of said cylinder being sufficient to provide a cylinder surface speed at least faster than the speed of the linear movement of said flexible elements.

2. Apparatus for amplifying the input signals to the movable output of instruments and the like, comprising:

(a) a first cylinder rotatable in one direction at a selected speed;

(b) a pair of flexible elements wrapped around said first cylinder, the pair of flexible element portions emerging from said cylinder with the direction of rotation being the input side and the pair of flexible element portions emerging from said cylinder against the direction of rotation connected to the movable output of the instrument;

(c) a second cylinder having its surface in close proximity and its axis substantially transverse to the flexible element portions comprising the input side and being rotated at a speed that provides a surface speed on said second cylinder that is less than the surface speed of said first cylinder;

(d) a rocker arm having a first pivoted position to contact one of the flexible element portions comprising the input side engaging said one of the flexible element portions with the moving surface of said second cylinder, a second pivoted position to contact the other one of the flexible element portions comprising the input side engaging said other one of said flexible element portions with the moving surface of said second cylinder, and a neutral position wherein both flexible element portions of the input side are unengaged; and (e) means for applying the input signal to said rocker arm said input signal pivoting said rocker arm.

3. Apparatus for amplifying the input signals to the movable output of instruments and the like according to claim 2 wherein said input signal is electrical and said means for applying the input signal to said rocker arm is a transducer.

4. An instrument for amplifying and recording electrical input signals, comprising:

(a) an amplifying drum rotatable in one direction at a selected speed;

(b) a pair of flexible elements wrapped around said amplifying drum with one end of each of said flexible elements emerging from said drum in a direction with the surface movement of the drum to provide an input side and with the opposite end of each of said flexible elements emerging from said drum in a direction counter to the surface movement of said drum to provide an output side, the ends of said flexible elements on the input side being joined together around an idler pulley and the ends of said flexible elements on the output side joined together around an output pulley;

(c) means connected to said output pulley to activate recording means on rotation of said drive pulley;

(d) a control drum having its surface in close proximity and its axis substantially transverse to the flexible elements on the input side, said drum being rotatable at a selected speed, the selected speed of said control drum providing a drum surface speed less than the drum surface speed of said amplifying drum;

(e) a rocker arm having a first roller at one end and a second roller at the opposite end, said rocker arm having a first pivoted position wherein said first roller moves one of said flexible elements on the input side into engagement with the surface of said control drum, a second pivoted position wherein said second roller moves the other of said flexible elements on the input side into engagement with the surface of said control drum and a neutral position wherein both flexible elements on the input side are disengaged from the surface of said control drum; and (f) a transducer connected to said rocker arm, said transducer receiving said input signal and pivoting said rocker arm in response to said input signal.

5. Apparatus as in claim 1, wherein said means (c) comprises means responsive to said input signal for frictionally engaging and disengaging said flexible element portions on said input side selectively in such manner that at any instant either (i) one said portion is driven longitudinally in the direction away from said cylinder, or (ii) the other said portion is driven longitudinally in the direction away from said cylinder, or (iii) neither said portion is driven and said portions remain stationary.

6. Apparatus as in claim 1, wherein said means (c) comprises a surface adjacent both said flexible element portions of said input side and continuously moving in a direction longitudinal with said portions and away from said cylinder, and means responsive to said input signal for selectively controlling the pressure between said surface and said portions such that at any instant said pressure is either (i) approximately equal and insubstantial at both said portions, so that they remain stationary, or (ii) substantial at a first said portion and insubstantial at the second, so that said surface frictionally engages said first portion and pulls it away from said cylinder, or (iii) substantial at said second portion and insubstantial at the first, so that said surface frictionally engages said second portion and pulls it away from said cylinder.

References Cited

UNITED STATES PATENTS 2,113,164 4/1938 Williams ------------ 318—28

FRED C. MATTERN, Jr., Primary Examiner

W. S. RATLIFF, Jr., Assistant Examiner

Dedication 3,491,603.—*Jeremy M. Harris*, Worthington, Ohio. MECHANICAL AMPLIFIER. Patent dated Jan. 27, 1970. Dedication filed May 7, 1973, by the assignee, *The Battelle Development Corporation.*

Hereby dedicates to the People of the United States the entire remaining term of said patent.

[*Official Gazette October 30, 1973.*]